(12) United States Patent
Kim

(10) Patent No.: US 7,274,221 B2
(45) Date of Patent: Sep. 25, 2007

(54) COMPARATOR CIRCUIT

(75) Inventor: Kang Yong Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 14 days.

(21) Appl. No.: 11/288,717

(22) Filed: Nov. 29, 2005

(65) Prior Publication Data

US 2007/0120581 A1    May 31, 2007

(51) Int. Cl.
*H03K 5/22* (2006.01)
(52) U.S. Cl. .............................. 327/77; 327/78; 327/63
(58) Field of Classification Search ..................... None
See application file for complete search history.

(56) References Cited

U.S. PATENT DOCUMENTS

| | | | | |
|---|---|---|---|---|
| 4,218,658 A | * | 8/1980 | Moeller | 327/18 |
| 4,423,384 A | * | 12/1983 | DeBock | 327/19 |
| 5,546,028 A | * | 8/1996 | Yamaguchi | 327/64 |
| 5,929,662 A | * | 7/1999 | Alexander et al. | 327/67 |
| 6,617,900 B1 | * | 9/2003 | Blair | 327/201 |
| 6,690,203 B2 | * | 2/2004 | Nyström et al. | 326/94 |

* cited by examiner

*Primary Examiner*—Kenneth B. Wells
*Assistant Examiner*—An T. Luu
(74) *Attorney, Agent, or Firm*—Wong, Cabello, Lutsch, Rutherford & Brucculeri, LLP

(57) ABSTRACT

An improved comparator circuit and associated methods are disclosed. In one embodiment, the comparator circuit comprises two voltage-to-time converter circuits, one for each input voltage to be compared, and an arbiter circuit for receiving the time-converted output of each converter. Each converter assesses the magnitude of its input voltage, and outputs a signal that is asserted at a time in inverse proportion to the magnitude of the input voltage. In one embodiment, producing the output signal at the asserted time comprises using the input voltage to gate a transistor whose discharge rate dictates the timing of the output signal. The two output signals arrive at an arbiter circuit whose function is to determine which output arrived at the arbiter first, as is indicative of the higher magnitude input voltage, and to set the output of the comparator accordingly.

64 Claims, 6 Drawing Sheets

COMPARATOR CIRCUIT

FIELD OF THE INVENTION

Embodiments of this invention relate to a comparator circuit for comparing the magnitude of two input voltages and for producing at least one output indicative of the comparison.

BACKGROUND

Comparator circuits are well known in the art of integrated circuits. In it simplest form, a comparator circuit compares two input voltages, and produces a single output voltage reflecting which of the two input voltages is larger. For example, in a simple comparator circuit, if Vin1>Vin2, then the output might equal a high logic state, i.e., a logic '1.' If Vin1<Vin2, then the output would equal a low logic state, i.e., a logic '0.' This comparison of the two voltages can then be used in various ways to perform useful functions on the integrated circuit. For example, in a Dynamic Random Access Memory (DRAM) circuit, a comparator is used to compare a reference voltage to an output voltage produced from an output driver model, with the results of the comparison used to generate control signals for the output drivers coupled to the I/O bond pads to adjust their output impedances. (For further details regarding the use of a comparator to calibrate output impedances, see U.S. patent application Ser. No. 11/210,009, filed Aug. 22, 2005, which is incorporated herein by reference in its entirety). In any event, this is just one example in which a comparator circuit can be used, and this disclosure is not limited to the use of a comparator in any particular environment.

FIG. 1 illustrates a prior art comparator circuit 10 used for output impedance calibration. This prior art comparator 10 is more complicated than that just explained in that it produces two outputs, DEC and INC as is useful in the unique environment of output impedance calibration. The comparator compares two input voltages, Vin and Vref, and, generally speaking, when Vin>Vref, DEC is asserted, which reflects that Vin is too high and is preferably decreased. Otherwise, when Vin<Vref, INC is asserted, reflecting that Vin is too low and is preferably increased. Because operation of the prior art comparator circuit will be clear to those of skill in the art, the circuitry of FIG. 1 is not explained in much detail. However, one skilled will recognize that the circuitry 10 comprises three stages: an amplifier stage 12; a latch stage 14; and an output buffer stage 16.

One circuit element particularly worthy of note is the differential sense amplifier (DSA) 20 that comprises a portion of the amplifier stage 12. As is known, the DSA 20 compares the two input voltages, Vin and Vref, and output voltages on nodes A and B indicative of the comparison. However, as used in the disclosed prior art comparator circuit 10, the DSA 20 is not ideal, as shown in FIG. 2. FIG. 2 shows the comparator circuit 10 of FIG. 1 as simulated under normal conditions (e.g., Vcc=1.5V; temperature=25 degrees C.). As simulated, the Vref was held to a midpoint voltage (600 mV) while Vin was gradually transitioned around this value. Specifically, as shown, Vin was ramped from 400 mV to 800 mV over a period of 500 nanoseconds, and then ramped back down to 400 mV again by 1000 nanoseconds, with the result that Vin=Vref at 250 and 750 microseconds.

Ideally, the prior art comparator circuit 10 should show a simulated output in which INC is a logic '1' (i.e., Vcc) from 0 to 250 nanoseconds and from 750 to 1000 nanoseconds (when Vin<Vref), and in which DEC is a logic '0' from 250 to 750 nanoseconds (when Vin>Vref). But, as simulated, the actual results deviate from this ideal. As shown in FIG. 2, while INC goes low at approximately 250 nanoseconds as it should, DEC does not go high until approximately 280 nanoseconds, resulting in an approximately 30 nanosecond gap Δ in which the output of the comparator 10 is indeterminate. Such a gap Δ is obviously not ideal, as valid inputs to the circuit do not timely produce valid outputs.

Moreover, even if it is assumed that the gap Δ is permissible, the circuit 10 should still perform with appropriate symmetry. In other words, if DEC. does not go high until approximately 280 nanoseconds, i.e., when Vin is some offset higher than Vref, symmetry would dictate that DEC should go low when Vin falls beneath that offset, i.e., at approximately 720 nanoseconds. However, as can be seen, such symmetry is not present: DEC does not fall at approximately 720 nanoseconds, but instead falls at approximately 750 nanoseconds. These non-symmetries in the comparator circuit 10 are the result of unwanted hysteresis in the circuit.

Ultimately, the non-ideal performance of the comparator circuit 10 (indeterminate outputs; hysteresis) result from the use of the DSA 20 in the circuit. As one skilled in the art will appreciate, a DSA will not work particularly well, or quickly, when the difference in potential between the two inputs (Vin, Vref) is small, e.g., on the order of 10 mV. The result of such a small differential input voltage is that it takes the DSA 20 longer to reliably establish an output voltage indicative of the comparison. Moreover, when the DSA 20 has been operated to output one state, it then becomes slightly more difficult to transition to the other state, resulting in the hysteresis effect just discussed.

In any event, such shortcomings from the comparator circuit of the prior art are unfortunate, and hamper the utility of the circuit in many applications, such as output impedance calibration, in which the output of the comparison of the two inputs must be made quickly and reliably, even when the differential between the two inputs is very small. Hence, it is a goal of this disclosure to provide a solution to this problem.

SUMMARY

An improved comparator circuit and associated methods are disclosed. In one embodiment, the comparator circuit comprises two voltage-to-time converter circuits, one for each input voltage to be compared, and an arbiter circuit for receiving the time-converted output of each converter. Each converter assesses the magnitude of its input voltage, and outputs a signal that is asserted at a time in inverse proportion to the magnitude of the input voltage. In one embodiment, producing the output signal at the asserted time comprises using the input voltage to gate a transistor whose discharge rate dictates the timing of the output signal. The two output signals arrive at an arbiter circuit whose function is to determine which output arrived at the arbiter first, as is indicative of the higher magnitude input voltage, and to set the output of the comparator accordingly. In one embodiment, the arbiter circuit comprises a latch, and produces one or two outputs indicative of the comparison of the two input voltages. In a modification, the outputs can be used to generate enable signals which are fed back to the comparator circuit to produce pulsed outputs allowing for a continuous comparison of the magnitudes of the two inputs. These pulsed outputs can in turn be filtered to produce true DC outputs for the comparator.

BRIEF DESCRIPTION OF THE DRAWINGS

Embodiments of the inventive aspects of this disclosure will be best understood with reference to the following detailed description, when read in conjunction with the accompanying drawings, in which.

DETAILED DESCRIPTION

Figure 1:
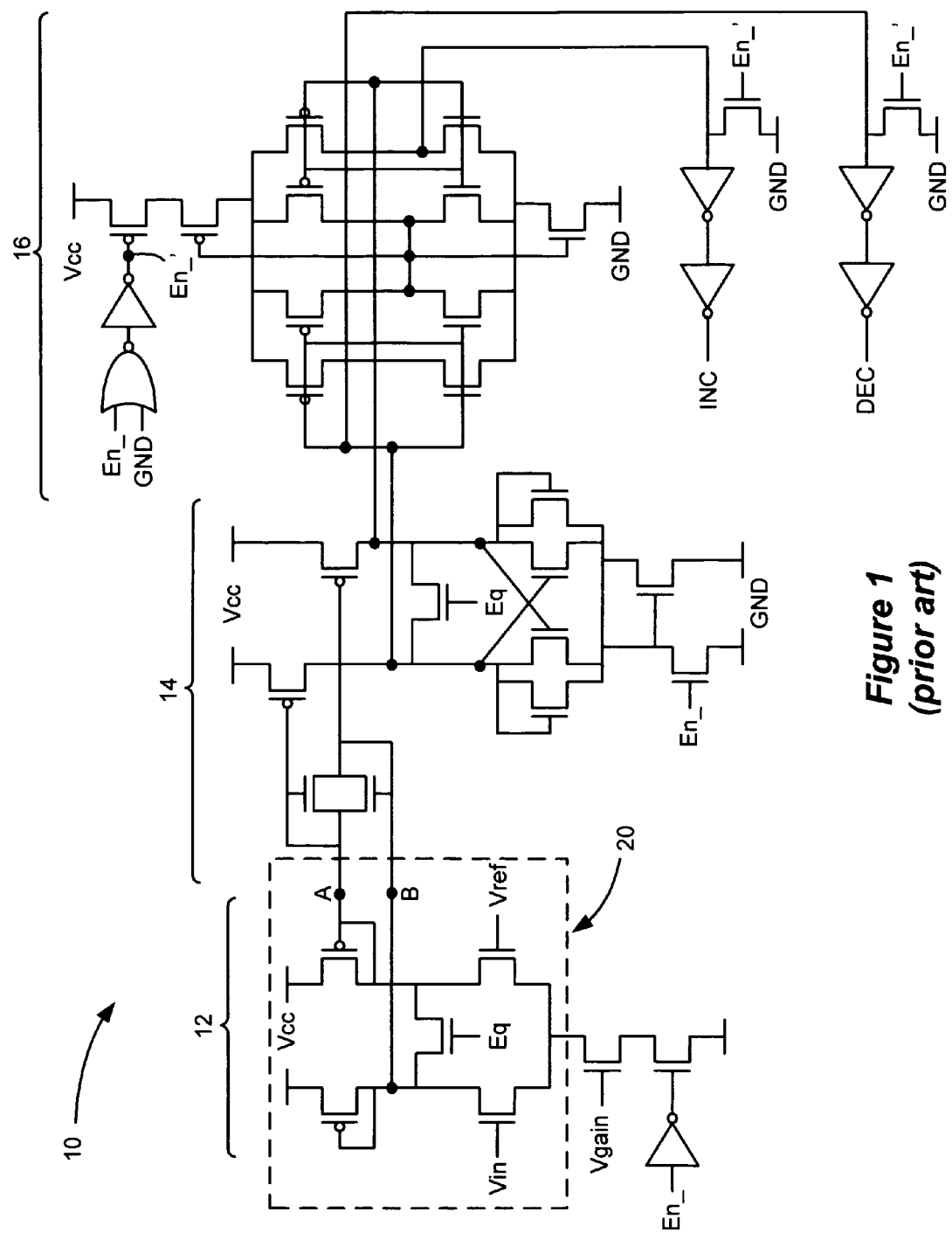
FIG. 1 illustrates a prior art comparator circuit.

A solution to the problem of hysteresis and indeterminate outputs in prior art comparator circuits of the type illustrated in FIG. 1 involves replacing the differential sense amplifier (DSA) 12 traditionally used in those circuits. As noted above, DSAs can suffer from hysteresis (resulting in non-symmetric operation of the circuitry) and from slow operation when the voltage differential between the inputs is small (resulting in an indeterminate output gap).

Figure 3:
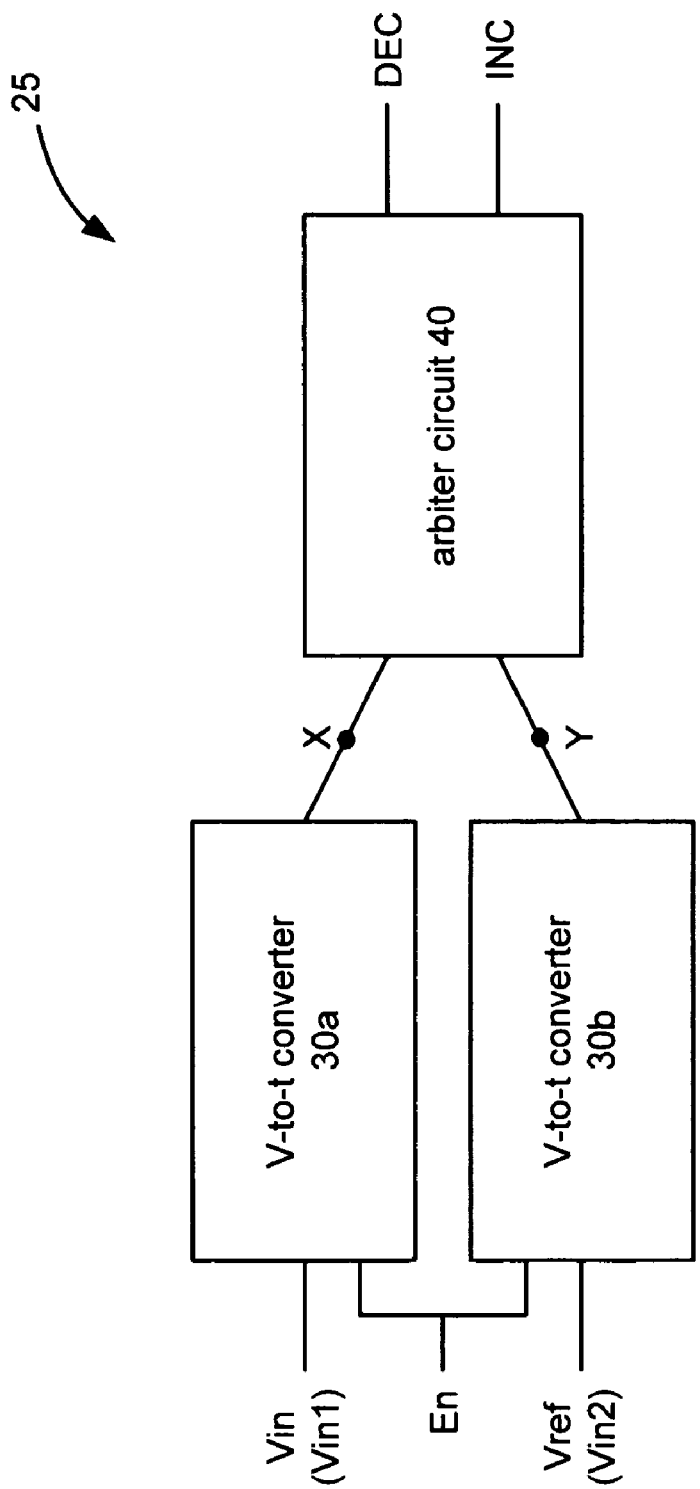
FIG. 3 illustrates an improved comparator circuit in block diagram form in accordance with an embodiment of the invention.

Accordingly, and as shown in FIG. 3 in block diagram form, and embodiment of an improved comparator circuit 25 in accordance with the invention detects the input voltages in a different manner. Specifically, each input (Vin and Vref if comparison of Vin to a fixed reference is desired; or Vin1 and Vin2 if comparison of two variable input voltages is required) is met by a circuit block 30a, 30b which converts the input signal from a voltage domain to a time domain. That is, the voltage-to-time converter circuits 30a, 30b assess the magnitude of the input voltages, and convert those voltage magnitudes to output signal (X and Y) whose asserted timing is adjusted according to that magnitude. Specifically, in the embodiment shown, and as will be explained in further detail below, the higher the magnitude of the input voltage, the more quickly the output signal is asserted. Thus, if Vin>Vref, output signal X will be asserted before output signal Y, which reflects the results of the comparison (i.e., that Vin>Vref). To then interpret this difference in timing between the output signals X and Y, an arbiter circuit 40 is used. As will be shown in further detail below, the arbiter circuit 40 essentially latches the first-to-arrive output signal, either X or Y, and sets the comparator outputs, DEC and INC, accordingly. Thus, if Vin>Vref, output DEC will be set by the arbiter circuit 40, and if Vin<Vref, output INC will be set by the arbiter circuit 40.

Figure 4:
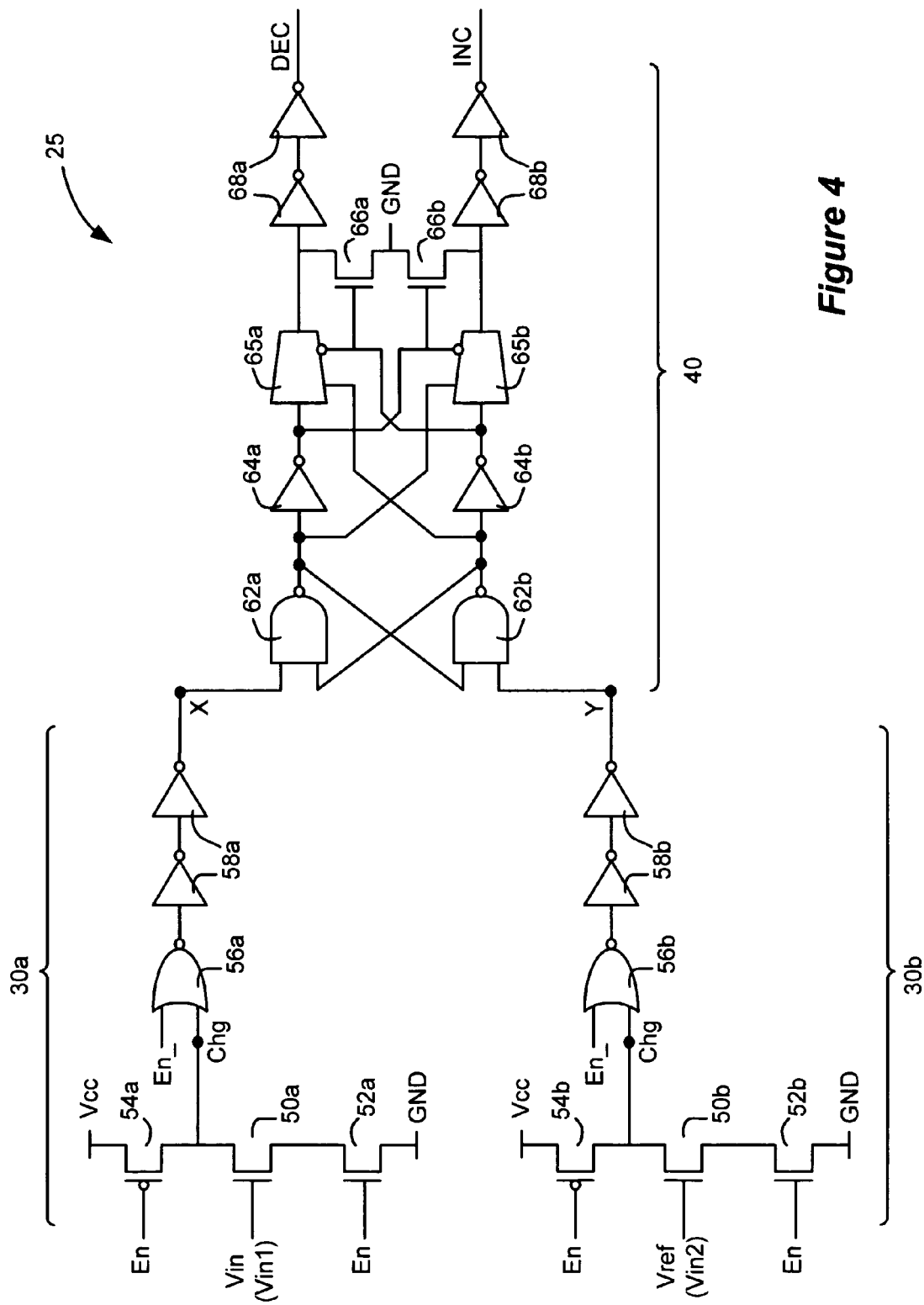
FIG. 4 illustrates the circuitry of the improved comparator circuitry of FIG. 3.

Such functionality of the improved comparator circuit 25 is better appreciated when its circuitry is understood, and exemplary circuitry is shown in FIG. 4. Specifically shown are circuits useable for the voltage-to-time converters 30a, 30b, and the arbiter 40. It is worth noting that other circuits with similar functionalities could be used in lieu of those depicted. The operation of voltage-to-time converters 30a, 30b are discussed first, and because they are identical, discussion proceeds with respect to converter 30a, although converter 30b operates in similar fashion.

The inputs to converter 30a include the input voltage Vin whose magnitude is to be reflected in a particular asserted timing of output signal X, and an enable signal (En). As shown, both En and its complement (En_) are used, and while exemplary means for generating of the enable signals will be discussed later in connection with FIG. 5, at this point it can be assumed that the enable signal (and its complement) simply comprise control signals generated by the logic of the integrated circuit in which the improved comparator circuit resides.

Initially, i.e., prior to useful operation of converter 30a, the enable signal En is low (i.e., 0V or logic '0'), and En_ is high. This condition turns on P-channel transistor 54a and turns of N-channel transistor 52a. Because transistor 54a is on, node Chg charges to Vcc. As a result of Chg being high, the output of NOR gate 56a is necessarily low ('0'), and as buffered by two serially-connected inverters 58a, output X is low.

When the converter 30 is operable to convert the input voltage Vin to a timed output signal X, En transitions high. This transition turns off P-channel transistor 54a, and turns on N-channel transistor 52a. Also, because En_ is now low, NOR gate 56a is now in a condition to output a '1,' should Chg also become low. Indeed, because transistor 52a is now on, and because transistor 50a is also on to some degree by virtue of the input voltage (Vin) applied at its gate, Chg (initially charged to Vcc via transistor 54a) will gradually discharge towards ground through the two transistors 50a and 52a.

It is the rate of this gradual discharge of node Chg that ultimately provides the voltage-to-time conversion. In this regard, note that the rate of discharge will depend on the magnitude of the input voltage, Vin. If Vin is relatively high, transistor 50a will be more strongly on, i.e., a greater channel will be formed in the transistor. This means the transistor 50a can draw a greater current, and accordingly can discharge node Chg at a relatively quick speed. By contrast, if Vin is relatively low, transistor 50a will be more weakly on, i.e., a more resistive channel will form. This means the transistor 50a can draw a lesser current, and accordingly will discharge node Chg at a slower speed. In short, the rate of discharge of node Chg is inversely proportional to the magnitude of the input voltage, Vin. To slow the rate of discharge, the channel lengths of the transistors in the discharge path (50a, 52a) are preferably made longer than otherwise-normal logic transistors, perhaps on the order of five times longer. Other schemes may also be used to slow the rate of discharge, such as by the use of resistors, capacitors, etc.

In any event, the rate at which node Chg discharges affects the speed at which NOR gate 56a will see two logic '0' inputs (the other input En_ being low at this point). Thus, if Chg discharges quickly, evidencing a relatively high input voltage, Vin, NOR gate 56a will output a logic '1' relatively quickly, and output node X (via buffer 58a) will go high relatively quickly. Conversely, if Chg discharges slowly, evidencing a relatively low input voltage, Vin, NOR gate 56a will output a logic '1' relatively slowly, and output node X will in turn go high relatively slowly.

Thus, when the two voltage-to-time converter circuits 30a and 30b are considered, the two outputs X and Y will arrive at the arbiter circuit 40 at different times depending on the relative magnitudes of the input voltages. Thus, if Vin>Vref, output X will be asserted high prior to output Y being asserted, and if Vin<Vref, output Y will be asserted high prior to output X being asserted. Of course, it is preferable in this embodiment that the circuitry and the various path lengths be identical in the two converter circuits 30*a*, 30*b* so that such circuitry will not affect the relative timings of the output signals X and Y.

It is worth noting that other voltage-to-time conversion circuitry could be used in lieu of the circuitry disclosed in FIG. 4. Moreover, while preferably disclosed as relying on the principle of assessing the rate of discharge through the input transistor 50*a*, it should be noted that the technique is equally effectuated by assessing a rate of transistor charging to the power supply Vcc or other high voltage. That is, node Chg could initially be grounded, and then coupled to Vcc via a P-channel pull up transistor (akin to 50*a*) to assess its relative rate of charging to Vcc. (In this case, it might be more logical to use a NAND gates in lieu of NOR gates 56, and to reverse the polarity of the enable input to that gate). In short, the disclosed technique by which an input voltage is converted to a timing signal via inputting that input voltage to a transistor can be effectuated by assessing both the transistor's charging and discharging.

The function of the arbiter circuit 40 is to determine which of the time-converted outputs X and Y have been asserted first, and to latch and output that state. In this regard, notice that NAND gates 62*a* and 62*b* form a cross-coupled latch circuit. Initially, prior to the enable signal En going high, i.e., before assessing the magnitude of the input voltages of the two converters 30*a*, 30*b*, outputs X and Y are low. As a result, the outputs of the NAND gates 62*a*, 62*b* are high, and are converted to low via the inverters 64*a*, 64*b*. Pass gates 65*a* and 65*b* are both on to pass these low voltages, which then pass through buffers 68*a*, 68*b*. In short, prior to sensing the input voltages, both DEC and INC are low.

Assume now that sensing is to take place, and that Vin>Vref. Enable signal En goes high, and the two nodes Chg start to discharge. Because Vin>Vref, output X will be asserted high before output Y, as explained above. When output X is asserted, the inputs to NAND gate 62*a*, are both high, making its output low, while the output of NAND gate 62*b* is still high. Inverter 64*a* thus outputs a high voltage, while inverter 64*b* outputs a low voltage. Pass gate 65*a* is enabled to pass the high voltage through the buffer 68*a*, resulting in DEC going high as it should (because Vin>Vref). Conversely, pass gate 65*b* is not enabled, and instead, transistor 66*b* is gated to pass a low logic state (GND) to the buffer 68*b*, such that output INC is held low, again as it should be.

Later, when output Y eventually goes high, the arbiter circuit 40 will have already latched the fact that output X has gone high earlier, and so the outputs of the arbiter circuit (DEC and INC) will not change. Thus, when Y later goes high, note that the output of NAND gate 62*a*, which is fed to the input of NAND gate 62*b*, has previously gone low. As a result, it does not matter when output Y goes high, as the output of NAND gate 62*b* will still output a logic '1' as it did before. In short, when output Y later goes high, the outputs of the arbiter circuit 40, DEC and INC, will not change.

Because the disclosed embodiment of the improved comparator circuit 25 ultimately relies on the principle of transistor discharging (i.e., via transistors 50, 52), operation of the circuit is very fast, especially compared to comparator circuit using differential sense amplifiers, and even when the differential voltage between the inputs is very small. Simulations run on the improved comparator circuit 25 of FIG. 4 show that even at differential voltages between the inputs of less than 10 mV, which render timing differences between the output signals X and Y on the order of tens of picoseconds, voltage/timing separation is sufficient to produce reliable outputs for the comparator, DEC and INC, within several nanoseconds.

Figure 5:
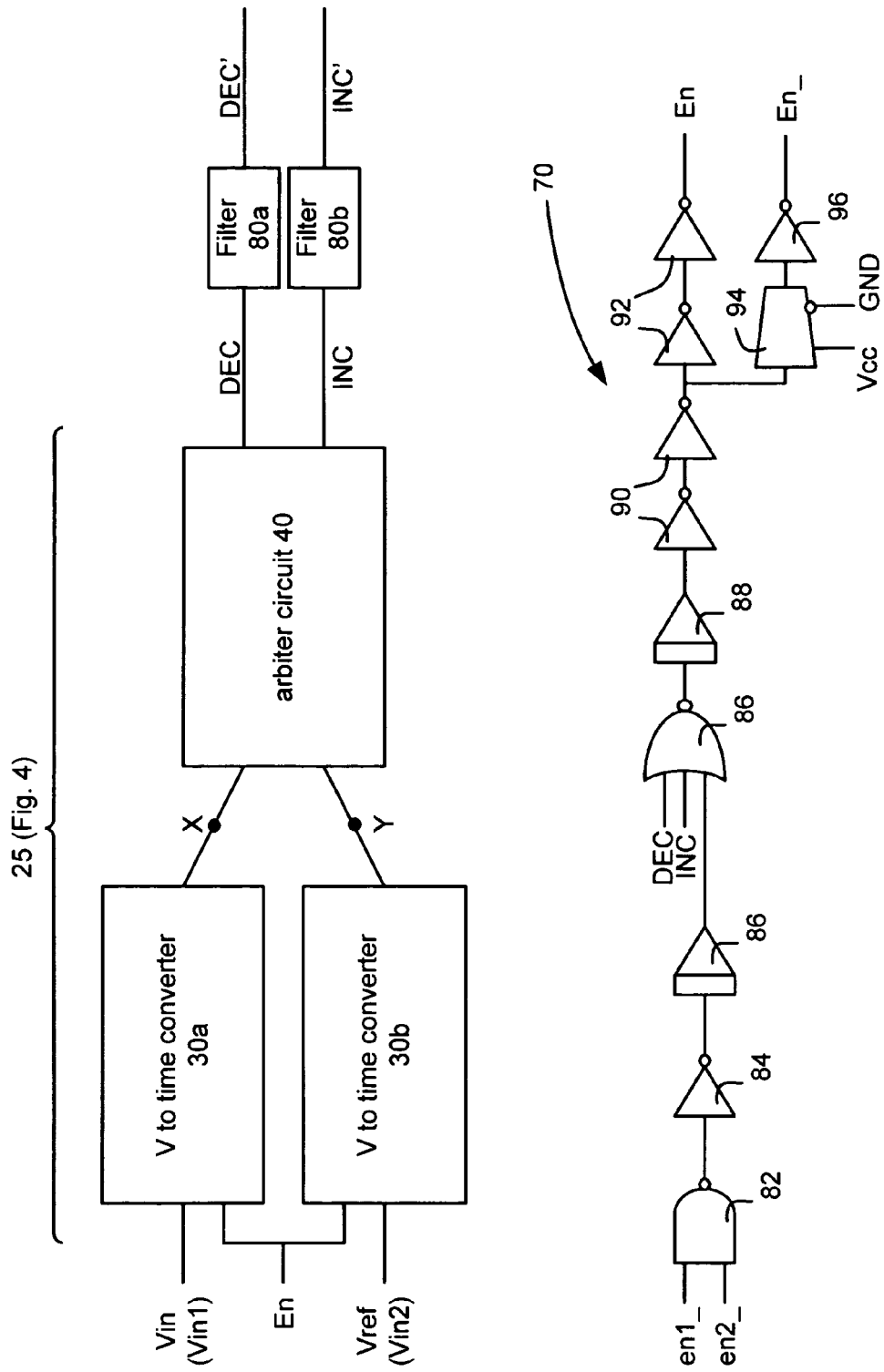
FIG. 5 illustrates optional additional circuitry to be used with the comparator circuitry of FIG. 4 which cyclically enables and disables the comparator circuitry to provide an oscillating, continuous output.

The embodiment of improved comparator circuit 25 of FIG. 4 works well for sampling, i.e., comparing, the input voltages (Vin and Vref, or Vin1 and Vin2) at a discrete point in time. In such an application, control signals En/En_ allow the circuit to be reset (En low) and activated (En high) to make the comparison. However, if it is required in a particular application to monitor and compare the inputs on a continuing basis, the circuitry 25 has to be continually enabled and disabled. Thus, in an alternative embodiment, the enable control signals are continually toggled to provide a running indication of the comparison at outputs DEC and INC. While in one embodiment the enable signals can simply be clocked, a preferred embodiment is shown in FIG. 5, in which enable control circuitry 70 is used.

As can be seen, enable control circuitry 70 provides feedback to the improved comparator circuit 25 and vice versa. That is, the enable control circuitry 70 produces the enables signal En and En_ for the improved comparator circuitry using the outputs of the comparator (DEC and INC) as inputs. Thus, assuming the circuitry is enabled by the assertion of any of various control signals such as en1_ and en2_, the circuitry will operate as follows.

First, proper control signal such as en1_ or en2_ can be used to enable the circuitry by providing a low input condition to NOR gate 86. (Two control signals are shown, both of which need to be active low via NAND gate 82 for this condition to occur, although more control signals, or a single control signal, could also be used). When such a low input to NOR gate 86 is provided by the control signals, and assuming initially that DEC and INC are low, NOR gate 86 outputs a '1,' which is delayed via delay gate 88, and buffered (90, 92, 94) to produce enable control signals En ('1') and En_ ('0'). When this occurs, the previously-charged nodes Chg in the converter circuits 30*a*, 30*b* begin to discharge, and the improved comparator circuit 25 begins to operate as discussed above. Ultimately, one of the two comparator 25 outputs, DEC and INC, will go high, depending on which input voltage, Vin or Vref, was larger. Either way, once one of DEC or INC goes high, this is fed back to enable control circuitry 70, which then results in NOR gate outputting a '0'. When this occurs, En is set to '0,' and En_ is set to '1'. This causes nodes Chg in the converters 30 to charge high, thus outputting a '0' on outputs X and Y. This in turn causes the outputs DEC and INC of the comparator 25 to both be low once again, which when fed back to the enable control circuitry 70 causes En to go high '1' so that sensing can again occur and cause one of the outputs DEC or INC to go high, etc.

Figure 2:
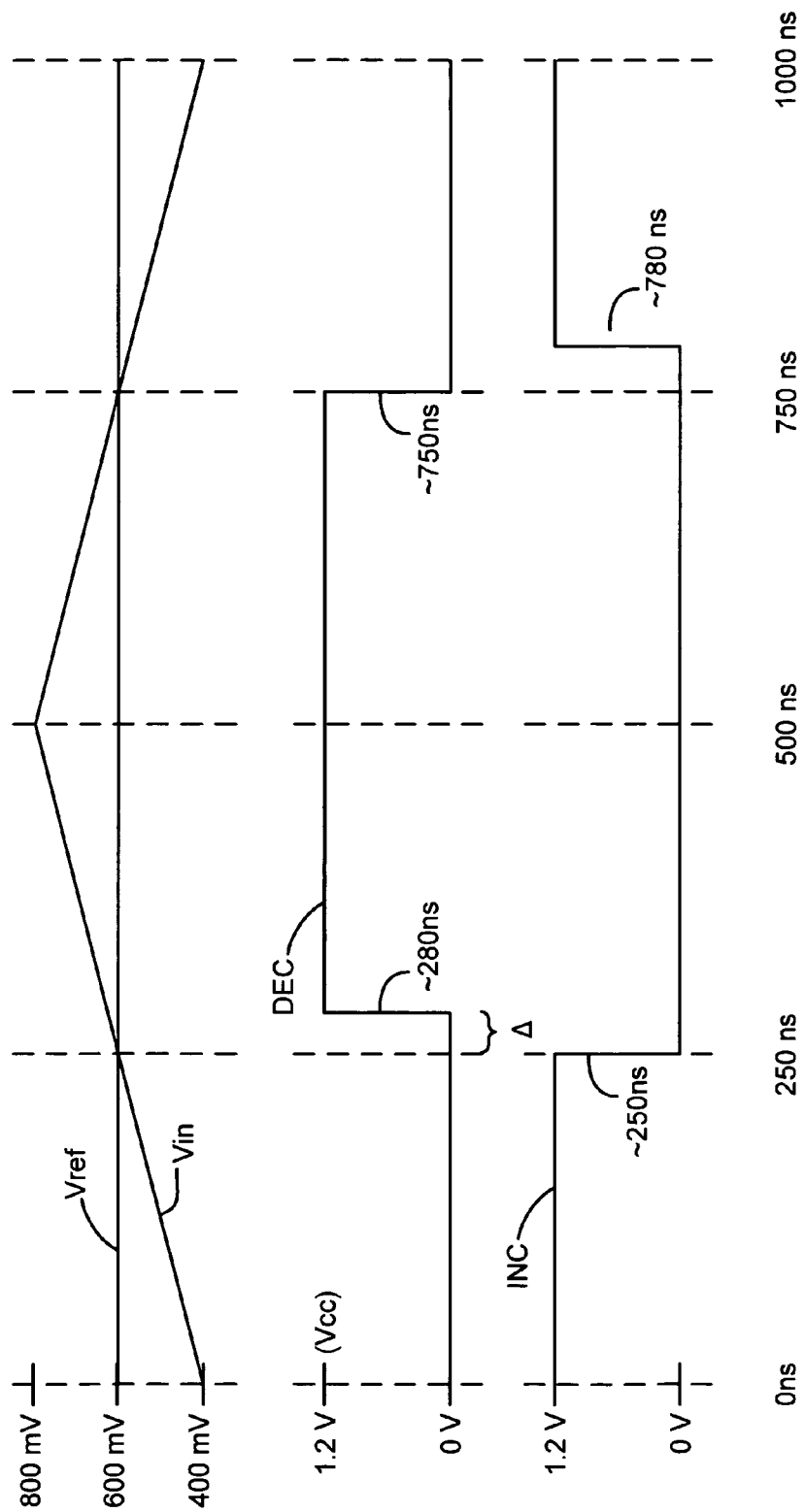
FIG. 2 illustrate the results of a simulation of the comparator circuit of FIG. 1, and shows that the outputs of the circuit suffer from hysteresis and from an indeterminate gap in which the outputs are uncertain.
Figure 6:
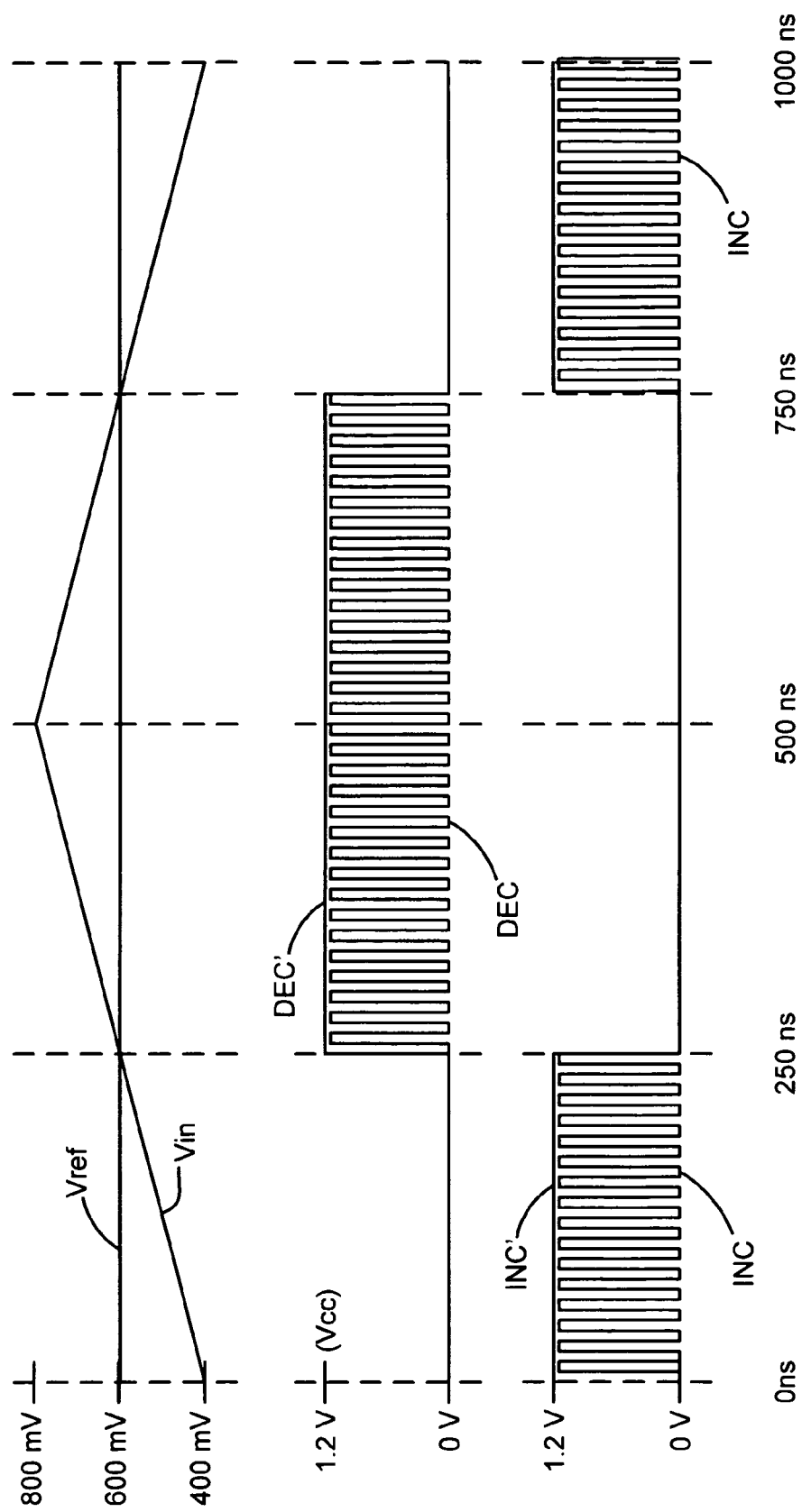
FIG. 6 illustrates the results of a simulation of the improved comparator circuit of FIGS. 4 and 5, and shows no discernable hysteresis and no significant indeterminate output gap.

The result is that the outputs of the comparator 25 will oscillate as the feedback mechanism cyclically enables and disables the comparator 25, with the period of the oscillation being dictated by the delay of delay gate 88 as well as native delays inherent in the circuitry. The results are shown in FIG. 6, which illustrates a simulation of the circuitry of FIG. 5 and is otherwise similar to the simulation of the prior art circuitry shown in FIG. 2. Notice that when Vin<Vref, i.e., between 0 and 250 nanoseconds and between 750 and 1000 nanoseconds, INC is asserted as would be expected, although such assertion of INC occurs as a series of pulses by virtue of the enable control feedback loop just described. By contrast, when Vin>Vref, i.e., between 250 and 750 nanoseconds, DEC is asserted, again as a series of pulses.

Because a pulsed output may not be appropriate in all applications in which the improved comparator circuit 25 can be used, the outputs DEC and INC can simply be fed to digital filters 80*a*, 80*b* to produce non-oscillating (i.e. DC) outputs DEC' and INC'. Many such fast-responsive digital filters can smooth the output pulses to provide a DC output, and hence the specific filter circuitry used in a given application is not important to the context of the invention.

Note also from FIG. 6 that the improved comparator circuit 25 does not suffer from the drawbacks of the prior art comparator circuit 10 discussed in the Background section. First, there is essentially no significant gap in the outputs where the results of the comparator are indeterminate. (There may of course be some small indeterminate gap, especially when it is considered that the unfiltered outputs in the disclosed embodiment oscillate, but any such gap would be on the order of nanoseconds, rather than tens of nanoseconds as was seen with the prior art comparator). Second, the improved comparator circuit 25 exhibits in simulation no discernable non-symmetry in the outputs, i.e., no discernable hysteresis. As a result, the comparator 25 as simulated exhibits superior performance when compared to the prior art comparator circuit 10.

Although disclosed as a two-output circuit, an arrangement beneficial to the output impedance calibration technique to which the invention was directed, one skilled in the art will recognize that the improved comparator circuit employing both voltage-to-timing stages and a arbiter stage can comprise a single output as well. In fact, one of the outputs (DEC or INC) can simply be dispensed with, as either one of these output signals individually is indicative of the results of the comparison (e.g., DEC high or pulsed means Vin>Vref, while DEC low means Vin<Vref). Again, while designed with a view towards use in output impedance calibration, it should be noted that the disclosed improved comparator circuit can be used in any application in which voltages comparisons are necessary or useful.

As used herein, elements electrically coupled should not be understood as requiring a direct connection. Instead, two circuit elements can be said to be coupled in an electrical sense even if other structures intervene between the two elements.

It should be understood that the inventive concepts disclosed herein are capable of many modifications. To the extent such modifications fall within the scope of the appended claims and their equivalents, they are intended to be covered by this patent.

What is claimed is:

1. A comparator circuit, comprising:
 a first converter circuit for receiving a first input voltage of a first magnitude and producing a first output signal whose timing is asserted as a function of the first magnitude;
 a second converter circuit for receiving a second input voltage of a second magnitude and producing a second output signal whose timing is asserted as a function of the second magnitude, wherein the second magnitude is independent of the first magnitude; and
 an arbiter circuit for receiving the first and second output signals, wherein the arbiter circuit produces at least one comparator output signal reflecting which of the first and second output signals first arrived at the arbiter circuit.

2. The circuit of claim 1, wherein the arbiter circuit produces two comparator output signals.

3. The circuit of claim 1, wherein the at least one comparator output signal is pulsed.

4. The circuit of claim 3, wherein the at least one comparator output signal is filtered to produce a DC output.

5. The circuit of claim 1, wherein the first and second output signals are respectively asserted in inverse proportion to the first and second magnitudes.

6. The circuit of claim 1, wherein the first and second converter circuits respectively produce the first and second output signals via a rate of charge or discharge through at least one transistor.

7. The circuit of claim 1, wherein the arbiter circuit comprises a latch.

8. The circuit of claim 7, wherein the latch is not affected by the first or second output signal that is not the first to arrive at the arbiter circuit.

9. The circuit of claim 1, wherein the first and second converter circuits receive at least one enable signal, and wherein producing the first and second output signals occurs upon assertion of the at least one enable signal.

10. A comparator circuit for comparing a first input voltage of a first magnitude and a second input voltage of a second magnitude, comprising:
 a first converter circuit for receiving the first input voltage and producing a first output signal whose timing is asserted in inverse proportion to the first magnitude;
 a second converter circuit for receiving the second input voltage and producing a second output signal whose timing is asserted in inverse proportion to the second magnitude, wherein the second magnitude is independent of the first magnitude; and
 an arbiter circuit for receiving the first and second output signals, wherein the arbiter circuit produces at least one comparator output signal indicative of the relationship of the first and second magnitudes.

11. The circuit of claim 10, wherein the arbiter circuit produces two comparator output signals.

12. The circuit of claim 10, wherein the at least one comparator output signal is pulsed.

13. The circuit of claim 12, wherein the at least one comparator output signal is filtered to produce a DC output.

14. The circuit of claim 10, wherein the first and second converter circuits respectively produce the first and second output signals via a rate of charge or discharge through at least one transistor.

15. The circuit of claim 10, wherein the arbiter circuit comprises a latch.

16. The circuit of claim 10, wherein the arbiter circuit produces the at least one comparator output signal by assessing which of the first and second output signals first arrived at the arbiter circuit.

17. The circuit of claim 10, wherein the first and second converter circuits receive at least one enable signal, and wherein producing the first and second output signals occurs upon assertion of the at least one enable signal.

18. A comparator circuit for comparing a first input voltage of a first magnitude and a second input voltage of a second magnitude, comprising:
 a first converter circuit, wherein the first converter circuit comprises a first transistor for receiving the first input voltage at its gate, wherein the first transistor produces a first output signal whose timing is asserted as a function of the first magnitude;
 a second converter circuit, wherein the second converter circuit comprises a second transistor for receiving the second input voltage at its gate, wherein the second transistor produces a second output signal whose timing is asserted as a function of the second magnitude, wherein the second magnitude is independent of the first magnitude; and a latch for receiving the first and second output signals and for producing at least one comparator output indicative of the comparison between the first and second input voltages.

19. The circuit of claim 18, wherein the latch produces two comparator output signals.

20. The circuit of claim 18, wherein the at least one comparator output signal is pulsed.

21. The circuit of claim 20, wherein the at least one comparator output signal is filtered to produce a DC output.

22. The circuit of claim 18, wherein the first and second output signals are respectively asserted in inverse proportion to the first and second magnitudes.

23. The circuit of claim 18, wherein the first and second converter circuits respectively produce the first and second output signals via a rate of charge or discharge respectively through the first and second transistors.

24. The circuit of claim 18, wherein the latch latches a first to arrive of the first and second output signals, and is not affected by the first or second output signal that is not the first to arrive.

25. The circuit of claim 18, wherein the first and second converter circuits receive at least one enable signal, and wherein producing the first and second output signals occurs upon assertion of the at least one enable signal.

26. A comparator circuit for comparing a first input voltage of a first magnitude and a second input voltage of a second magnitude, comprising:

a first converter circuit for receiving the first input voltage and at least one enable signal, the first converter circuit for producing a first output signal whose timing is asserted as a function of the first magnitude when the at least one enable signal is toggled;

a second converter circuit for receiving the second input voltage and the at least one enable signal, the second converter circuit for producing a second output signal whose timing is asserted as a function of the second magnitude when the at least one enable signal is toggled, wherein the second magnitude is independent of the first magnitude; and an arbiter circuit for receiving the first and second output signals, wherein the arbiter circuit produces at least one comparator output signal reflecting which of the first and second output signals first arrived at the arbiter circuit.

27. The circuit of claim 26, wherein the arbiter circuit produces two comparator output signals.

28. The circuit of claim 26, wherein the at least one comparator output signal is pulsed.

29. The circuit of claim 28, wherein the at least one comparator output signal is filtered to produce a DC output.

30. The circuit of claim 26, wherein the first and second output signals are respectively asserted in inverse proportion to the first and second magnitudes.

31. The circuit of claim 26, wherein the first and second converter circuits respectively produce the first and second output signals via a rate of charge or discharge through at least one transistor.

32. The circuit of claim 26, wherein the arbiter circuit comprises a latch.

33. The circuit of claim 32, wherein latch is not affected by the first or second output signal that is not the first to arrive at the arbiter circuit.

34. The circuit of claim 26, wherein the at least one enable signal is cycled.

35. The circuit of claim 26, wherein the at least one enable signal is formed using the at least one comparator output signal as feedback.

36. A method for comparing a first input voltage of a first magnitude and a second input voltage of a second magnitude, comprising:

concurrently assessing the first input voltage and the second input voltage by producing a first output signal whose timing is asserted as a function of the first magnitude and producing a second output signal whose timing is asserted as a function of the second magnitude, wherein the second magnitude is independent of the first magnitude; and determining which of the first and second output signals is first asserted to produce at least one comparator output signal indicative of the relationship of the first and second magnitudes.

37. The method of claim 36, wherein the determining step is performed by an arbiter circuit.

38. The method of claim 36, wherein the at least one comparator output signal is pulsed.

39. The method of claim 38, further comprising filtering the at least one comparator output signal to produce a DC output.

40. The method of claim 36, wherein the first and second output signals are respectively asserted in inverse proportion to the first and second magnitudes.

41. The method of claim 36, wherein the first and second output signals are respectively asserted via a rate of charge or discharge through at least one transistor.

42. The method of claim 36, wherein the determining step is performed by a latch.

43. The method of claim 42, wherein the latch is not affected by the first or second output signal that is not the first to be asserted.

44. The method of claim 36, wherein concurrent assessment of the first and second input voltages is effectuated by assertion of at least one enable signal.

45. The method of claim 44, wherein the at least one enable signal is cycled.

46. The method of claim 44, wherein the at least one enable signal is formed using the at least one comparator output signal as feedback.

47. A method for comparing a first input voltage of a first magnitude and a second input voltage of a second magnitude, comprising:

concurrently assessing the first input voltage and the second input voltage by producing a first output signal whose timing is asserted as a function of the first magnitude and producing a second output signal whose timing is asserted as a function of the second magnitude, wherein the timing of the assertion of the first and second outputs is dictated by the rate of charging or discharging respective first and second transistors respectively gated by the first and second input voltages, wherein the second magnitude is independent of the first magnitude;

latching which of the first and second output signals is first asserted; and outputting at least one comparator output signal from the latch, wherein the comparator output signal indicates the larger of the first and second magnitudes.

48. The method of claim 47, wherein the determining step is performed by an arbiter circuit.

49. The method of claim 47, wherein the at least one comparator output signal is pulsed.

50. The method of claim 49, further comprising filtering the at least one comparator output signal to produce a DC output.

51. The method of claim 47, wherein the first and second output signals are respectively asserted in inverse proportion to the first and second magnitudes.

52. The method of claim 47, wherein the latching step is not affected by the first or second output signal that is not the first to be asserted.

53. The method of claim 47, wherein concurrent assessment of the first and second input voltages is effectuated by assertion of at least one enable signal.

54. The method of claim 53, wherein the at least one enable signal is cycled.

55. The method of claim 53, wherein the at least one enable signal is formed using the at least one comparator output signal as feedback.

56. A method for comparing a first input voltage of a first magnitude and a second input voltage of a second magnitude, comprising:
   repeatedly enabling and disabling first and second converter circuits, wherein the first and second converter circuits, when enabled, respectively produce first and second output signals whose timings are respectively asserted as a function of the first and second magnitudes, wherein the second magnitude is independent of the first magnitude; and
   repeatedly determining which of the first and second output signals is first asserted to produce at least one pulsed comparator output signal indicative of the relationship of the first and second magnitudes.

57. The method of claim 56, wherein the determining step is performed by an arbiter circuit.

58. The method of claim 56, further comprising filtering the at least one pulsed comparator output signal to produce a DC output.

59. The method of claim 56, wherein the first and second output signals are respectively asserted in inverse proportion to the first and second magnitudes.

60. The method of claim 56, wherein the first and second output signals are respectively asserted via a rate of charge or discharge through at least one transistor.

61. The method of claim 56, wherein the determining step is performed by a latch.

62. The method of claim 61, wherein the latch is not affected by the first or second output signal that is not the first to be asserted.

63. The method of claim 56, wherein the first and second converter circuits are repeatedly enabled and disabled via at least one enable signal.

64. The method of claim 63, wherein the at least one enable signal is formed using the at least one comparator output signal as feedback.

* * * * *